United States Patent [19]

Pittman

[11] 4,311,046
[45] * Jan. 19, 1982

[54] MULTIPLE SENSING DEVICE AND SENSING DEVICES THEREFORE

[75] Inventor: Roland Pittman, Maitland, Fla.

[73] Assignee: Applied Devices Corporation, Kissimmee, Fla.

[*] Notice: The portion of the term of this patent subsequent to Apr. 15, 1997, has been disclaimed.

[21] Appl. No.: 51,924

[22] Filed: Jun. 25, 1979

Related U.S. Application Data

[62] Division of Ser. No. 795,575, May 10, 1977, Pat. No. 4,197,737.

[51] Int. Cl.³ .............................................. G01C 23/00
[52] U.S. Cl. ..................................... 73/178 R; 73/510
[58] Field of Search ................. 73/504, 505, 509, 510, 73/511, 517 R, 517 A, 178 R, 189, 228

[56] References Cited

U.S. PATENT DOCUMENTS

| | | | |
|---|---|---|---|
| 3,273,397 | 9/1966 | Forward | 73/505 X |
| 3,842,681 | 10/1974 | Mumme | 73/505 |
| 4,197,737 | 4/1980 | Pittman | 73/178 R |

Primary Examiner—James J. Gill
Attorney, Agent, or Firm—Nolte and Nolte

[57] ABSTRACT

A multiple sensing device has sensors, mounted on a common rotatable shaft, for sensing magnetic field, electric field, gas flow, angular acceleration and linear acceleration. The latter three of the sensing devices employ piezo electric crystals as the sensors, while the magnetic field sensor employs a pair of rotating coils and the electric sensing device employs a pair of rotating electrodes.

5 Claims, 20 Drawing Figures

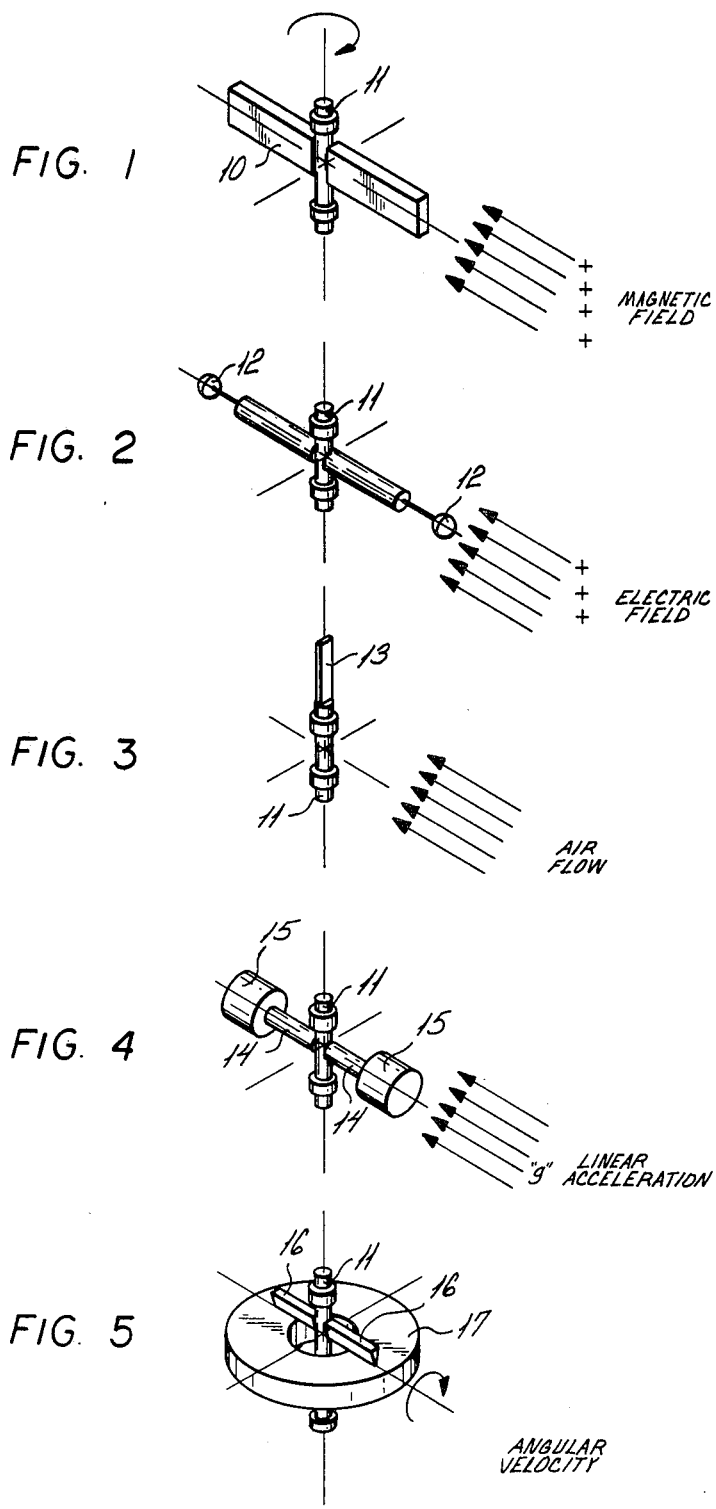

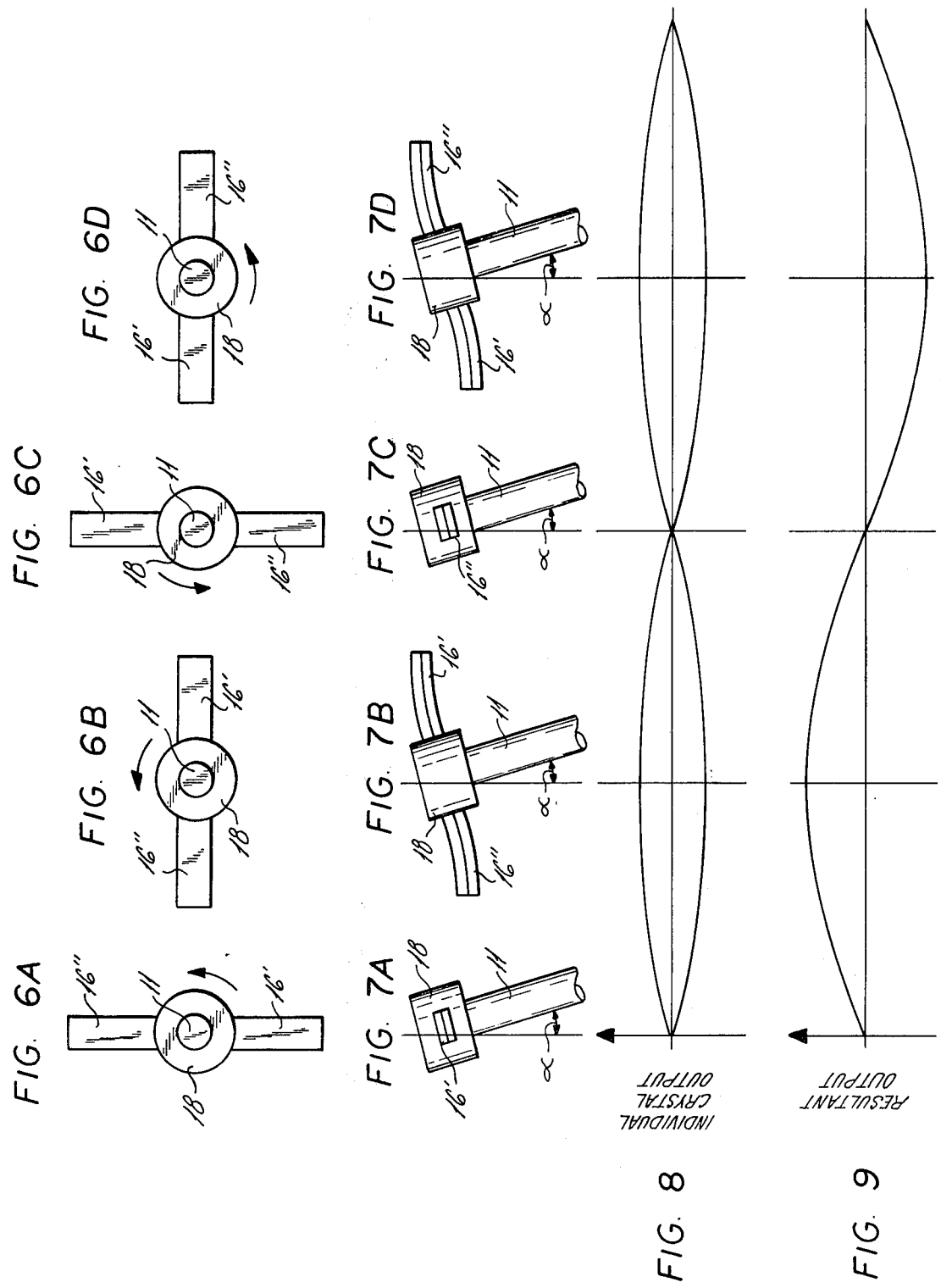

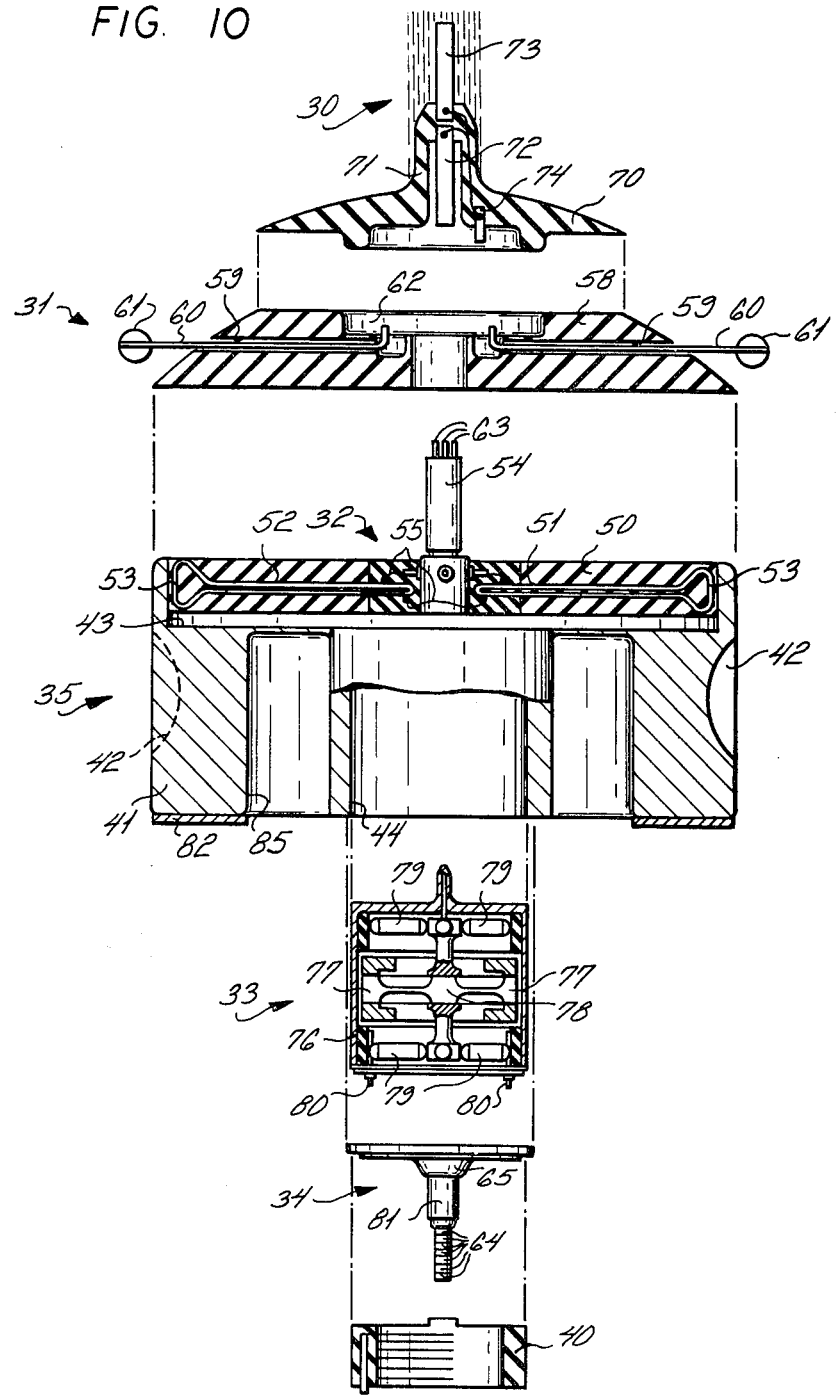

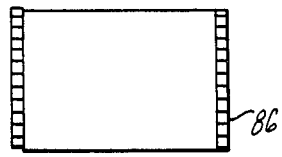
FIG. 11
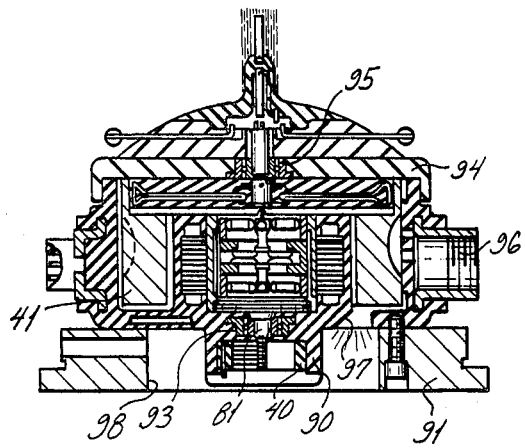
FIG. 12
FIG. 13
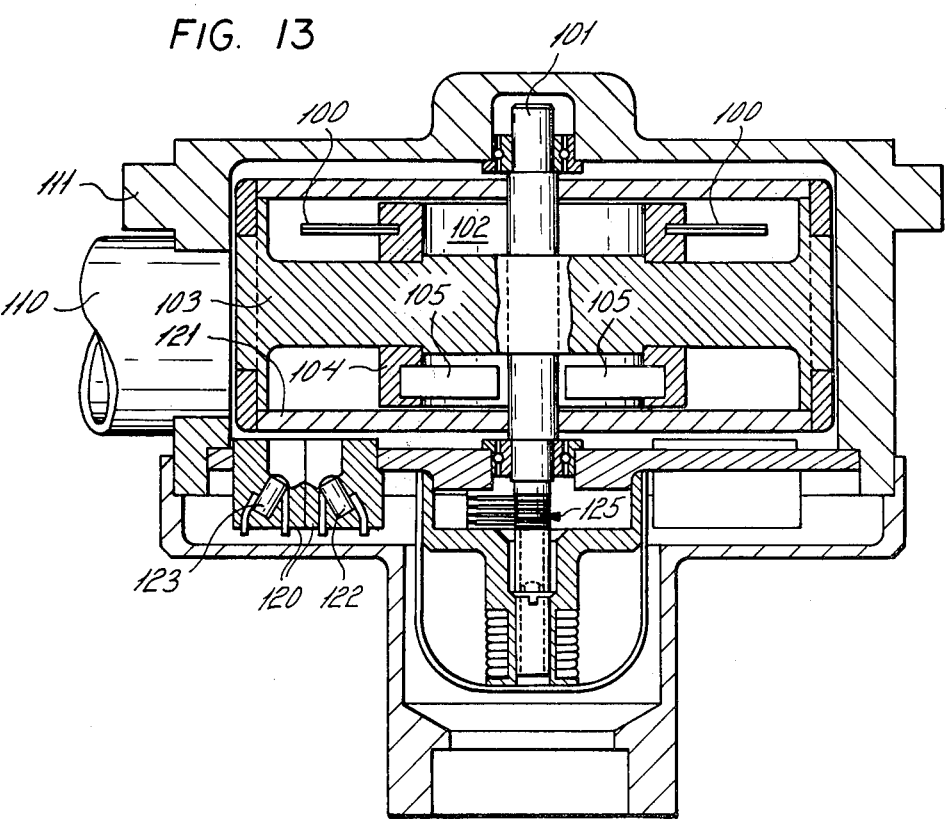

MULTIPLE SENSING DEVICE AND SENSING DEVICES THEREFORE

This is a division of application Ser. No. 795,575, filed May 10, 1977, now U.S. Pat. No. 4,197,737.

BACKGROUND OF THE INVENTION

This invention relates to sensing devices for physical characteristics, and is more particularly directed to a low cost sensing device for sensing such parameters as magnetic field, electric field, gas flow, linear acceleration and angular acceleration. The invention is particularly directed to simplified devices or combination of devices of this type, which are particularly adaptable for use in aircraft. It will, of course, be apparent that the invention may be advantageously employed in other fields.

While devices are known for the detection of each of these parameters, in general the devices are relatively expensive, so that their use is restricted, and they are not adaptable to application having limited life. The present invention is therefore directed to the provision of a novel multiple sensing device of low cost, which is capable of accurately sensing all of these above parameters. The invention is also concerned with the provision of separate sensing devices for sensing each of these parameters.

SUMMARY OF THE INVENTION

Briefly stated, in accordance with the invention, one or more sensing devices is mounted for rotation on a shaft, and commutator means are connected to enable coupling of the sensed voltage from the sensing device. The sensing devices are adapted to produce alternating voltage signals, the instantaneous maximum amplitudes of the signals corresponding generally to the vector of the measured physical characteristic in a given plane, such as a plane normal to the axis of rotation. As a consequence, substantially complete data regarding the physical characteristics may be provided by employing two of the multiple sensing devices.

In accordance with the invention, a magnetic field sensing device, for determining a magnetic field vector normal to the shaft, comprises a pair of magnetic coils symmetrically affixed to rotate with the shaft. A sensing device for ascertaining the vector of an external electric field may comprise a pair of electrodes mounted for rotation with the shaft, with the external ends of the electrodes being uninsulated. Gas flow, such as air flow, in a direction normal to the axis of the shaft may be detected by a crystal plate mounted, preferably on the end of the shaft, this crystal being bendable about an axis parallel to the plate and normal to the shaft. Angular acceleration about axes normal to the shaft may be detected by a pair of crystals extending radially from the shaft, and having bending axes normal to the shaft. The radially outer extremities of the latter crystals may be joined by a symmetrical, i.e. annular, reaction mass. In addition, linear acceleration normal to the shaft may be obtained by a pair of similar crystals compressable in a direction normal to the axis of the shaft. Masses may also be provided at the radial outer extremities of these crystals.

BRIEF DESCRIPTION OF THE DRAWINGS

In order that the invention will be more clearly understood, it will now be disclosed in greater detail with reference to the accompanying drawings, in which:

FIGS. 1-5 are simplified illustrations of magnetic field, electric field, gas flow, linear acceleration and angular rate sensing devices employed in accordance with the invention;

FIGS. 6A-6D are views illustrating, in simplified form, four consecutive positions of the sensing rotor of FIG. 5;

FIGS. 7A-7D are figures illustrating, consecutively, the side views corresponding to the views of FIGS. 6A-6D, respectively;

FIG. 8 illustrates the output of the two crystals of FIGS. 6A-6D and 7A-7D;

FIG. 9 illustrates the sum of the voltages generated as illustrated in FIG. 8;

FIG. 10 is an exploded cross-sectional view of a portion of a multi-probe assembly in accordance with a preferred embodiment of the invention;

FIG. 11 is a cross-sectional view of an electric motor rotor that may be employed in combination with the system of FIG. 10;

FIG. 12 is a cross-sectional view of a multi-probe assembly, incorporating the elements of FIG. 10;

FIG. 13 is a cross-sectional view of a further embodiment of a multi-probe assembly, in accordance with the invention.

DESCRIPTION OF THE PREFERRED EMBODIMENTS

Figure 14:
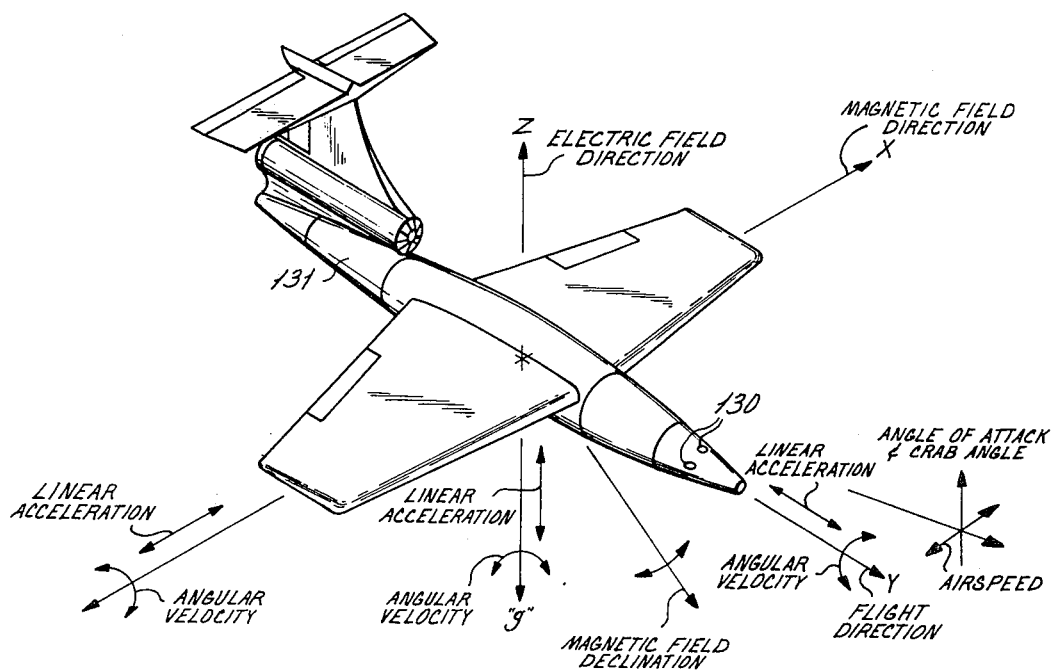
FIG. 14 is a simplified illustration of one application of a pair of multi-probe assemblies in accordance with the invention, on an aircraft.

The present invention is directed to the provision of a multiple sensing device, particularly adaptable for use on aircraft, but which may of course have other applications. The concept of a multiple sensing device for physical parameters necessitates the combination of individual sensing devices adaptable to combination, for sensing purposes, in an accessable manner, in order to achieve the desired end result, and hence the present invention of necessity incorporates a member of individual sensing elements responsive to different physical characteristics. The individual sensing devices may, of course, have separate utility, even though they are particularly adaptable to being combined for the desired purpose.

Referring now to the drawings, FIGS. 1-5 illustrate in simplified form the principles of operation of the five sensing devices with which the present invention is primarily concerned. It will, of course, be apparent that a multiple sensing device in accordance with the invention may additionally incorporate other sensing means, or that, when desired, one or more of the illustrated sensing means may be omitted.

As those treated in FIG. 1, a magnetic field sensing device is comprised of a pair of identical coils 10 mounted in a column plane on opposite sides of a shaft 11, for rotation with the shaft. Assuming the shaft extends into the coordinate direction Z and that the coils are connected externally by way of a suitable commutator, the device of FIG. 1 will produce an alternating voltage of a frequency corresponding to the rotary speed of this shaft, and having an instantaneous peak when the plane of the coils is aligned with an external magnetic field, such as the earth's magnetic field. The magnitude of the output voltage is dependent upon the component of the external magnetic field in the X/Y plane. In the arrangement of FIG. 1, it is apparent that the greatest portion of the output voltage is developed by the radially outermost portions of the coils.

The output voltage is a sign wave when the field is linear. When the incident magnetic field is not linear, i.e. contains gradients, harmonics of the fundamental are generated. In the simple case, the second harmonic is the most dominant. In effect, the main field and the gradient fields give uniquely different signal frequencies.

In the electric field sensor illustrated in FIG. 2, a pair of electrodes 12 extend radially in opposite directions from the shaft 11, with the radiantly outermost portions of the electrodes being uninsulated. The radiantly intermediate portions of the electrodes are preferably insulated. It is apparent that, with the inner ends of the electrodes connected externally of the device by way of a suitable commutator, the device will produce a sine wave voltage output of a frequency corresponding to the rate of rotation of the shaft 11. The voltage arises from the fact that the non-insulated radially outer ends of the electrodes 12 rotate in a static electric field, such as the static electric field of the earth, whereby the instantaneous maximum of the sine wave voltage output occurs when the electrodes are aligned with this electric field. The amplitude of the voltage corresponds to the gradient of the static electric field in the X/Y plane.

In the sensing device of FIG. 3, a plate piezo electric crystal 13 is mounted on one end of the shaft 11 for rotation therewith. The plane of the crystal 13 is parallel to the axis of the shaft 11, and the crystal is arranged so that it may be bent about axes normal to the axis of the shaft 11. Suitable electrodes of conventional nature (not shown) are affixed to the crystal, so that stress upon the crystal normal to the shaft 11 results in the generation of a piezo electric voltage, which may be directed externally of the device by a suitable commutator assembly. If a component of a gas flow is in the X/Y plane of the device, it is apparent that the gas flow, impinging upon the crystal, will stress the crystal so that an alternating voltage will be produced. The alternating voltage will have a frequency corresponding to the rate of rotation of the shaft 11 with the instantaneous peaks occurring when the bending axis of the crystal is normal to the component of the gas direction in the X/Y plane. The crystal may be referred to as a "bender" crystal. The amplitude of the voltage corresponds to the component of the gas flow in the X/Y plane, assuming, as above, that the shaft extends in the Z direction. In the arrangement of FIG. 3, the crystal thus serves as a restoring spring and a signal generator, and may be advantageously employed as an air mass data probe.

In FIG. 4, a pair of crystals 14 are mounted on opposite sides of the shaft 11, for rotation therewith. The crystals 14 are oriented to be compressible in a direction normal to the shaft 11. If desired, suitable masses 15 may be provided at the radially outer extremities of the crystals 14. If suitable leads are connected conventionally to the crystals 14, and directed externally of the device by way of a suitable commutator assembly, it is apparent that an alternating output voltage will be produced having a frequency corresponding to the rate of rotation of the shaft. The instantaneous maximum of the voltage occurs when the crystals are aligned with a component of linear acceleration in the X/Y plane, and the amplitude of the output voltage thus corresponds to the linear acceleration of the shaft in the X/Y direction. The sensitive axes of the crystals are thus oriented to react to acceleration parallel to the spin plane of the device. The two crystals are electrically interconnected in order to provide an additive output for these two elements.

In FIG. 5, two crystals 16 are also mounted on opposite sides of the shaft 11. In the arrangement of FIG. 5, however, the crystals are mounted to be bendable, and have bending axes normal to the axis of the shaft. If desired, a reaction mass such as annular mass 17 may be provided symmetrically at the radially outer ends of the crystals. The arrangement of FIG. 5 constitutes an angular velocity probe, based upon the gyroscopic operation of an elastically restrained body rotating at high velocity. The initial member and the restoring springs thus constitute the same element, as in the case of the air mass data probe of FIG. 3 and the linear acceleration probe of FIG. 4. The two bender crystals are arranged in a dipole fashion for common mode rejection and inertial balance. In the arrangement of FIG. 5, angular momentum of the masses reacting as a result of an applied angular velocities at right angles to the spin axis of shaft 11, results in the generation of a voltage by the crystals which is sinusoidal in distribution and exhibits a frequency identical to the rate of rotation of the shaft. The two crystals of the arrangement of FIG. 5, are preferably interconnected to their respective commutators in the opposite sense from that of the device of FIG. 4.

The operation of the rate gyro of FIG. 5 may be more readily understood with reference to FIGS. 6–9. Thus, FIGS. 6A–6D represent four consecutive positions of the crystals, with counterclockwise revolution, as may be seen from the end of the shaft 11. In these figures, the two crystals are identified as crystals 16' and 16". The shaft is assumed to be continuously rotating. Referring to FIG. 7, which depicts a side view of the device of FIG. 6, it is assumed that the axis of the shaft 11 has been displaced through an angle alpha. The shaft 11 and the hub 18 on the shaft in which the crystals 16' and 16" are mounted, are adequately rigid so that they both may substantially instantaneously exhibit their new positions without deformation. The radially outer ends of the crystals, however, due to gyroscopic action, remain for some time oriented as though the angular displacement of the shaft 11 had not occurred. This is, of course, particularly true if a reaction mass is linked to the radially outer ends of the crystals. As a consequence of the gyroscopic action, the crystals bend about their mechanical axes, as illustrated in FIGS. 7A–7D, respectively, to result in output voltages as illustrated in FIG. 8. It is thus seen that the instantaneous peaks of the resultant alternating voltage occur when the crystals extend normal to the axis of rotation about the angle alpha. Since the outputs of the crystals are of different polarity, the crystals are interconnected in reverse senses, to produce the resultant output voltage as illustrated in FIG. 9.

In the arrangement of FIGS. 5–9, it is apparent that the crystals are employed as gyroscopic elements, with or without the provision of a reaction mass, and that the strain on the crystals is proportional to input angular rate. The amplitude of the output is proportional to the input angular rate, and the phase of the output is related to the direction of the input angular rate of angular displacement of the rotating shaft in a direction normal to the axis of the shaft. In other words, if the shaft 11 is angularly displaced about an axis in the X/Y plane, the output of the rate gyro or angular velocity sensor of FIG. 5 is proportional to the rate of rotation about the axis in the X/Y plane, then the phase of the output voltage is related to the orientation of the axis of rotation in the X/Y plane, assuming again that the shaft 11 extends in the Z direction.

FIG. 10 is an exploded partially cross sectional view of a portion of a multi-probe assembly in accordance with a preferred embodiment of the invention. This view illustrates primarily the rotor components, to show that they can be of modular construction, whereby a multi-probe assembly may be fabricated of any of the desired sensing probes. It will of course be apparent that the cover construction for such a multi-probe assembly will be dependent upon the components chosen for use in the assembly.

As illustrated in FIG. 10, the multi-probe assembly is comprised of an air data probe 30, an electric field probe 31, a magnetic field probe 32, an angular velocity and linear acceleration probe 33, and a slip ring 34 and brush block assembly 40. In addition, the assembly includes a gas drive ring 35 for the pneumatic drive of the rotor. All of the elements of FIG. 10, except the brush block assembly 40, constitutes a part of the rotor.

The gas drive assembly 35 may be comprised of a metallic ring 41 having gas drive slots 42 on its radially outer periphery, whereby the ring may be rotated by directing a jet of air tangentially against this outer periphery. The ring 41 has a recess 43 in one face thereof, for receiving the magnetic field probe 32. In addition, a circular coaxial recess 44 is provided in the other face for receiving the angular velocity and linear acceleration probe 33.

The magnetic field probe is comprised of a circular disc 50 of insulating material, within which the two magnetic sensing coils 51 and 52 are embedded. The coils 51 and 52 have radially outer extremities 53 which extend axially of the disc for substantially its full axial dimension. The coils 51 and 52, which are identical, have radial returns squashed down axially, as illustrated in FIG. 10, with the axial extension of the radial innermost portions of the coil being at a minimum. As a consequence, the radial returns are so positioned with respect to the spin axis of the device that the axial return is near the center of rotation. This in effect gives the section line at the major radius most of the charge generating capacity for the probe. The disc 50 is fitted, by suitable conventional means, for rotation on a shaft 54. The shaft 54 is preferably hollow, and serves as a bearing for the assembly, to extend through a housing (not shown in FIG. 10). Suitable interconnecting wires for the coils 51 and 52, as well as for interconnecting the coils to the slip ring assembly, are illustrated at 55.

The shaft 54 may be affixed only to the magnetic sensing assembly, with the ring 50 being fitted tightly for rotation in the recess 43. Alternatively, the shaft 54 may extend through the ring 50 and be fitted to the gas drive ring 41.

The electric field probe 31 and the air data probe 30 are adapted to sense data which requires their physical location outside of the housing of the device. Consequently, the electric field probe may be comprised of an insulating disc 58 having a central bore adapted to fit over the shaft 54. The disc 58 may be connected to the shaft 54 for rotation by any conventional means. The disc 58 has a pair of radially extending holes 59 through which the electrodes 60 extend. Suitable enlarged ends, such as conductive balls 61, may be provided at the ends of the electrodes 60 for sensing the earth's static electric field. The inner ends of the electrodes 60 extend into a recess 62 in the face of the disc 58, for interconnection with conductors 63 extending through the shaft 54, the conductors 63 advantageously extending completely through the device for interconnection with the slip rings 64 of the slip ring assembly 65.

As will be apparent from the following disclosure, a portion of the housing of the device may extend between the magnetic field probe and the electric field probe.

The air data probe is also comprised of an electrically insulating rotating body member 70 having a disc shaped base adapted to fit for rotation either into the recess 62 of the electric field probe or, if desired, directly on the end of the shaft 54. The body 70 may be an axial extension 71 for enclosing a crystal 72. A further crystal 73 extends axially beyond the insulating body 70, to serve as the air flow sensor as above described. The crystal 72 within the extension 71 serves as a reference, and is thereby interconnected differentially with the crystal 73. The conductor connected to these crystals may be led to a connector 74 affixed in the base 70, for interconnection with the slip ring conductors 63.

The angular velocity and linear acceleration probe may form a combined unit 33, as illustrated in FIG. 10. For this purpose, the assembly may be comprised of a cylindrical housing 76 adapted to be fitted for rotation in the recess 44 of the gas drive ring. The housing 76 may contain a pair of radially extending crystals 77 at a central portion, extending to a hub 78, to serve as the linear acceleration probe as discussed in accordance with the above principles. The linear acceleration probe is disposed axially centrally of the device 33. In addition, a plurality of pairs of bender crystals 79 may be positioned axially on each side of the linear acceleration probe, for the sensing of angular velocity as discussed above. Suitable conventional conductors are provided (but this is not shown) connected to the crystals, for interconnection with the slip ring assembly 65.

The slip ring assembly 65 may be fitted directly to the lower end of the assembly 33, for example, on studs 80 on the lower end of the assembly 33, in order to complete the rotary structure of the device. The slip ring assembly has a plurality of slip rings 64, adapted to be connected to each of the sensing probes as above discussed. While the drawing of FIG. 10 does not show these conductors, it is apparent that suitable apertures may be provided in the housings of the structure, for enabling the necessary interconnections. For this purpose, it is of course not necessary that a single shaft extend throughout the rotor assembly, since the individual components of the structure may be provided with internally embedded conductors for this purpose. As a consequence, it is apparent that a modular construction may be achieved, whereby the elements may be interconnected as desired.

While the brush block 40 for cooperation with the slip ring assembly 34 is not a rotary member, it has been illustrated in simplified form in FIG. 10, to illustrate in general a preferred manner by which the signals generated in the various probes may be led externally of the device. The slip rings 64 may be at the axial end of the slip ring assembly, axially beyond a bearing portion 81 of the rotor assembly, in order to simplify construction of the device.

In the use of the device in accordance with the invention, it is of course necessary to establish the phases of the different alternating voltages generated by the sensing devices, in order to be able to ascertain the directions of the various sensed physical quantities. For this purpose, in accordance with one embodiment of the invention, reference markings 82 may be provided on one face of the gas drive ring 41, for cooperation with a suitable sensing device, such as a photoelectric sensing device 123 of conventional nature as illustrated in FIG. 13. It will of course be apparent that any other forms of reference generated of conventional nature may alternatively be employed in combination with the multi-probe device of FIG. 10.

While the device of FIG. 10 is particularly adaptable for gas drive, it will be apparent that it may also be employed with an electric motor drive. For this purpose, the gas drive ring 41 is provided with an annular recess 85 radially outwardly of the recess 44. A motor rotor 86 for example as illustrated in FIG. 11, may be mounted in the recess 85, for rotation with the rotor. The recess 85 has a sufficient radial dimension that a stator assembly affixed to the housing (not shown in FIG. 10) may also be fitted into recess 85. For example, the stator may extend axially from the end housing of the assembly. It is therefore apparent that the device of FIG. 10 may be modified for electric drive with a minimum of modification.

FIG. 12 shows the assembly of FIG. 10 in cross section, with the elements of the rotor interconnected together in their preferred form. In addition, it shows the brush block assembly 40 mounted in a recess in insulating housing, 90, for cooperation with a slip ring assembly. The housing member 90 serves as one cover of the device, and is bolted to a metal base block 91, for example, to enable the rigid mounting of the device as desired. In addition, the central portion of the housing 92 is affixed to the base 91. The housing 90 is provided with suitable bearings 93, to engage the portion 81 of the shaft of the rotor. The upper portion 94 of the housing, which serves as a cover, extends between the magnetic and electric field sensor, and is provided with bearings 95 for the shaft portion 54. The portions 92 and 94 of the housing may also be of insulating material.

The arrangement of FIG. 12 is adapted for gas drive, and for this purpose the housing 92 is provided with a gas drive inlet 96, positioned to direct air or other gas against the turbine blades of the gas drive ring 41. An outlet for the gas may extend by way of an aperture 97 in the lower cover 90, which communicates with an aperture 98 in the mounting base 91.

As discussed above, the multi-probe sensor in accordance with the invention may be formed of a lesser number of components. Thus, as illustrated in FIG. 13, the multi-probe sensor is comprised of a rotary unit incorporating only a pair of bender crystals 100 mounted for rotation with a shaft 101. The crystals 100, as is apparent in FIG. 13, do not extend inwardly to the shaft, their bases being fixed in a suitable block or hub 102 radially outwardly spaced from the shaft 101 proper. In the arrangement of FIG. 13, the hub or blocks 102 are affixed to one side of a web of the gas drive ring 103, and a further hub or set-up blocks 104 is provided on the other side of the web. From these blocks or hub a pair of additional bender crystals 105 are provided extending radially inwardly. The inner ends of these latter crystals are not rigidly affixed to any component of the structure. The crystals 105 are mounted so that they are bendable about axes parallel to the shaft 101. As a consequence, the output of the crystals 100 corresponds to angular rate, and the output of crystals 105 corresponds to acceleration.

A gas inlet 110 is provided in the housing 111 for driving the shaft 101. In addition, the reference generator 120, discussed above, is mounted in the housing 111 for cooperation with the suitable reference scale 121 on a face of the gas drive ring 103. The reference generator may comprise a reference source of light 122, such as an LED, cooperating with a suitable photosensitive device 123 of conventional nature, for producing a reference signal output related to the position of the rotor of the device. The device of FIG. 13 is provided with a suitable slip ring and brush assembly 125.

It will of course be apparent that other combinations of units may be employed, in accordance with the invention.

Since the multi-probe sensor in accordance with the invention provides two axis data, a pair of such multi-probe assemblies may be employed to provide all the necessary three-dimensional data with respect to the measured physical quantity. This is particularly useful, for example, in aircraft. Thus, as illustrated in FIG. 14, a pair of multi-probe devices 130 of the type illustrated in FIGS. 10 and 12 may be mounted with orthogonal axes on an aircraft 131. This arrangement enables the inputting of sufficient data to the aircraft to enable the calculation of the earth's magnetic and electric field, as well as external air flow and linear acceleration and angular velocity of the aircraft. The probe assembly is inexpensive, and readily fabricated.

It is of course apparent that the electric circuits for comparison of the phase of the reference generator with the measured quantity may be of conventional nature, and hence need not be discussed in detail in this specification.

Typical performance characteristics of a multi-probe assembly, in accordance with the invention, are provided in Table 1 of this disclosure.

It is further apparent that this multi-probe assembly, in accordance with the invention, by employing a single rotary shaft, reduces cost and power consumption in the provision of needs for sensing the necessary data, as well as a decrease in volume and mechanical complexity by an order of magnitude. Further, it is apparent that the majority of components of the structure may be formed of molded plastic.

While the invention has been disclosed and described with reference to a limited number of embodiments, it will be apparent that variations and modifications may be made therein, and it is intended in the following claims to cover each such variation and modification as falls within the true spirit and scope of the invention.

TABLE 1

| PARAMETERS | I<br>X/Y<br>AXIS MAG | II<br>"Z"<br>AXIS MAG | III<br>X/Y<br>AXIS ELEC | IV<br>AIR<br>SPEED |
| --- | --- | --- | --- | --- |
| SCALE FACTOR (V.D.C.) | 5.V/GS | 5.V/GS | .017V/V/MTR | .010V/MPH |
| BIAS (TOTAL VECTOR) | <.002 GS | <.01 GS | <3.V/MTR | <2.MPH |
| NULL UNCERT. (HR TO HR) | <.0005GS RMS | <.0005GS RMS | <.5V/MTR RMS | <.3MPH RMS |

TABLE 1-continued

| | | | | |
|---|---|---|---|---|
| NULL UNCERT. (TRN ON TO) (TRN ON) | <.0008GS PP | <.0005GS PP | <1.V/MTR PP | <.5MPH PP |
| NULL UNCERT. (SPIN VEL.) (VAR. ± 10%) | <.001GS PP | <.0005GS PP | <1.V/MTR PP | <2.MPH PP |
| LINEAR OPERATING RANGE | 1.0 GS | 1.0 GS | 300V/MTR | 500.MPH |
| MAX. OVERRANGE INPUT | 5.0 GS | 5.0 GS | 1000.V/MTR | 1000.MPH |
| LINEARITY (%DEVIA.FR) (NOM. S.F.) | <1.% | <1.% | <2.% | <2.% |
| SYMMETRY (SLOPE AGREEMENT) | <1.% | <1.% | <2.% | — |
| CROSS AXIS COUPLING | <2.% | — | <2.% | BY THE COS. OF AIRFLOW ∢ |
| CROSS QUANTITY ALIGNMENT | <±.5° | <±.5° | <±.5° | <±.5° |
| CROSS QUANTITY COUPLING | | | | |
| I. X/Y AXIS MAG FIELD | 100% | — | NEGL. | NEGL. |
| II. "Z" AXIS MAG FIELD | — | 100% | NEGL. | NEGL. |
| III. X/Y AXIS ELEC FIELD | NEGL. | NEGL. | 100% | NEGL. |
| IV. X/Y AIR SPEED | NEGL. | NEGL. | <.001V/MTR/MPH | 100% |
| V. ANGLE OF AIR FLOW | NEGL. | NEGL. | NEGL. | — |
| VI. X/Y AXIS ANG VEL | NEGL. | NEGL. | NEGL. | NEGL. |
| VII. X/Y AXIS LIN ACCEL | NEGL. | NEGL. | NEGL. | <.02MPH/"g" |

| PARAMETERS | V ∢AIR FLOW | VI X/Y ANG. VEL. | VII X/Y LIN. ACCEL. |
|---|---|---|---|
| SCALE FACTOR (V.D.C.) | .165V/DEG | .017V/DEG/SEC | .250V/"g" |
| BIAS (TOTAL VECTOR) | <.5° | <.02°/SEC | <.002"g" |
| NULL UNCERT. (HR TO HR) | <.1°RMS | <.003°/SEC RMS | <.0005"g" RMS |
| NULL UNCERT. (TRN ON TO) (TRN ON) | <.25°PP | <.008°/SEC PP | <.0008"g" PP |
| NULL UNCERT. (SPIN VEL.) (VAR. ± 10%) | <.30°PP | <.01°/SEC PP | <.002"g" PP |
| LINEAR OPERATING RANGE | ±30.° | 300°/SEC | 20 "g" |
| MAX. OVERRANGE INPUT | ±180° | 1200°/SEC | 100 "g" |
| LINEARITY (%DEVIA.FR) (NOM. S.F.) | <1.5% | <1.% | <.5% |
| SYMMETRY (SLOPE AGREEMENT) | <1.5% | <1.% | <.5% |
| CROSS AXIS COUPLING | BY THE AMPLITUDE OF AIRSPEED | <2.% | <.5% |
| CROSS QUANTITY ALIGNMENT | <±.5° | <±.25° | 0°(REF.) |
| CROSS QUANTITY COUPLING | | | |
| I. X/Y AXIS MAG FIELD | NEGL. | NEGL. | NEGL. |
| II. "Z" AXIS MAG FIELD | NEGL. | NEGL. | NEGL. |
| III. X/Y AXIS ELEC FIELD | NEGL. | NEGL. | NEGL. |
| IV. X/Y AIR SPEED | — | NEGL. | NEGL. |
| V. ANGLE OF AIR FLOW | 100% | NEGL. | NEGL. |
| VI. X/Y AXIS ANG VEL | NEGL. | 100% | <.00005"g"/DEG. |
| VII. X/Y AXIS LIN ACCEL | <.05°/"g" | <.0002°/SEC/"g" | 100% |

What is claimed is:

1. A multiple sensing device comprising a rotatable shaft, first piezoelectric crystal sensing means mounted for rotation with said shaft for producing an output voltage responsive to angular acceleration about an axis normal to said shaft, and second piezoelectric crystal sensing means mounted for rotation with said shaft for producing an output voltage responsive to linear acceleration of said shaft in a direction normal to the axis of the said shaft, said piezoelectric crystal means being mounted independently of one another to extend in mutually orthogonal planes which intersect the axis of said shaft, further including third sensing means for producing an output voltage responsive to the flow of gas externally of said device, said third sensing means comprising a piezoelectric crystal in the form of a plate mounted at an end of said shaft, the plane of said plate extending parallel to the axis of said shaft, and longitudinally from the end of said shaft.

2. The multiple sensing device of claim 1 further comprising fourth and fifth sensing means mounted for rotation with said shaft for sensing magnetic and electric fields in a plane perpendicular to the axis of said shaft.

3. A multiple sensing device comprising a housing, a shaft rotatably mounted in and extending through said housing, a first pair of bender piezoelectric crystals rotatable with said shaft within said housing and mounted on opposite sides of said shaft with their bending axes normal to said shaft, a second pair of bender piezoelectric crystals rotatable with said shaft within said housing and mounted on opposite sides of said shaft with their bending axes parallel to said shaft, said shaft having one end extending outside said housing, a further bender piezoelectric crystal mounted on said one end of said shaft and extending therefrom axially of said shaft, magnetic field sensing means mounted for rotation with said shaft within said housing, and electric field sensing means mounted for rotation with said shaft between said housing, and said last mentioned crystal.

4. The multiple sensing device of claim 3, further comprising means for rotating said shaft including an annular member mounted to said shaft and having gas driving vane members at its periphery, said annular member having a central recess within which said first and second pairs of crystals are mounted.

5. A multiple sensing device comprising a housing, a shaft rotably mounted in said housing, an annular member affixed to said shaft and having gas drive slots at its periphery, said housing having apertures therein for directing a supply of gas to said gas drive slots, said annular member also including means for inductively rotating said shaft, a plurality of piezoelectric crystals mounted with different orientations for rotation with said shaft, whereby voltages corresponding to different parameters are generated by said crystals, computer means connected to said crystals to enable the coupling of said voltages from said device, and means for sensing the position of the shaft.

* * * * *